(12) United States Patent
Jung

(10) Patent No.: US 7,183,861 B2
(45) Date of Patent: Feb. 27, 2007

(54) CIRCUITS AND METHODS FOR DETECTING PHASE LOCK

(75) Inventor: Woo-Young Jung, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 55 days.

(21) Appl. No.: 11/179,365

(22) Filed: Jul. 12, 2005

(65) Prior Publication Data

US 2006/0022757 A1    Feb. 2, 2006

(30) Foreign Application Priority Data

Jul. 27, 2004    (KR) ...................... 10-2004-0058592

(51) Int. Cl.
*H03L 7/095* (2006.01)
(52) U.S. Cl. .................. 331/1 A; 331/DIG. 2
(58) Field of Classification Search ................ 331/1 A, 331/17, 18, 25, DIG. 2; 327/156–159; 332/127; 360/51; 375/376; 455/260

See application file for complete search history.

(56) References Cited

U.S. PATENT DOCUMENTS

| | | | | |
|---|---|---|---|---|
| 4,668,917 A * | 5/1987 | Levine | .......................... | 327/12 |
| 6,496,554 B1 | 12/2002 | Ahn | ........................... | 375/376 |
| 2002/0094054 A1 | 7/2002 | Lee | ............................ | 375/376 |
| 2005/0073343 A1 | 4/2005 | Kim et al. | ................... | 327/156 |

FOREIGN PATENT DOCUMENTS

| | | |
|---|---|---|
| JP | 09-036735 | 2/1997 |
| JP | 2002-344312 | 11/2002 |
| KR | 1992-0014072 | 7/1992 |
| KR | 1995-0002376 | 1/1995 |
| KR | 1999-0080623 | 11/1999 |
| KR | 1020020022918 | 3/2002 |
| KR | 1020020042161 | 6/2002 |
| KR | 10-2005-0033896 | 4/2005 |

* cited by examiner

*Primary Examiner*—David Mis
(74) *Attorney, Agent, or Firm*—Mills & Onello LLP

(57) ABSTRACT

In a phase-locked loop circuit including a lock detection function, the phase-locked loop circuit includes a lock detection circuit. The lock detection circuit includes a lock-window-entry detection circuit and a lock-detection-signal generation circuit. The lock-window-entry detection circuit detects a front edge of an up signal or a down signal generated by a phase frequency detector at a front edge of a delayed up signal or a delayed down signal to generate a lock-window-entry detection signal, wherein the delayed up signal or the delayed down signal is delayed substantially by as much as a lock window. The lock-detection-signal generation circuit counts an input signal of a phase-locked loop circuit to generate a lock detection signal when the lock-window-entry detection signal is continuously enabled for a predetermined time period. In this manner, a lock detection signal is output only when the phase locking operation has been completed.

29 Claims, 14 Drawing Sheets

CIRCUITS AND METHODS FOR DETECTING PHASE LOCK

CROSS-REFERENCE TO RELATED APPLICATIONS

This application relies for priority upon Korean Patent Application No. 2004-58592 filed on Jul. 27, 2004, the contents of which are herein incorporated by reference in their entirety.

BACKGROUND OF THE INVENTION

1. Field of the Invention

The present invention relates to a phase-locked loop circuit, and particularly to a phase-locked loop circuit capable of providing a lock detection signal after achieving a phase lock state.

2. Description of the Related Art

Phase-locked loop (PLL) circuits are one of the basic building blocks in modern electronic systems. They have enjoyed widespread use in communications, multimedia, and other applications. Frequency synthesizers, FM demodulators, clock recovery circuits, modems, and tone decoders are examples of applications that employ PLL circuits.

The PLL circuit is a negative feedback control system. As shown in FIG. 1, the PLL circuit generally includes a phase-frequency detector (PFD) 100, a charge pump 200, a loop filter 300, a voltage-controlled oscillator (VCO) 400, and a frequency divider 500. The PFD 100 generates an up signal SUP and/or a down signal SDN based on the phase (and/or frequency) difference between a reference signal SIN and a feedback signal SFEED. The charge pump 200 generates an output signal having a level that varies according to the status of the up signal SUP and/or the down signal SDN. The output signal of the charge pump 200 is provided to an input VCOI of the VCO 400 through the loop filter 300, which removes high frequency component of the output signal of the charge pump 200. The VCO 400 generates high frequency signal that varies according to the DC level of the input voltage VCOI. The frequency divider 500 generates the feedback signal SFEED having a low frequency that is based on the high frequency signal output from the VCO 400. The feedback signal SFEED is applied to an input of the PFD 100. When the PLL circuit is in a lock mode, the phase (and/or frequency) of the reference signal SIN and the phase of the feedback signal SFEED are locked. When the PLL circuit is not in the lock mode, the phase (and/or frequency) of the reference signal SIN and the phase of the feedback signal SFEED are not locked.

The output of the VCO 400 may be available only when the PLL circuit is locked. Accordingly, there is a need for a lock detection circuit capable of determining whether the PLL circuit is operating in the lock mode or in the unlock mode. One example of the lock detection circuit is disclosed in Japanese Patent Application Laid-Open Publication No. 2002-344312. However, according to Japanese Patent Application Laid-Open Publication No. 2002-344312, in some situations, lock detection cannot be accurately performed due to noise, and, in those cases, a lock detection signal can be incorrectly generated when the PLL circuit is not in an entirely locked state.

In Korean Patent Application Laid-Open Publication No. 2005-0033896, the applicant of which is the same as that of this invention, a phase-locked loop circuit capable of outputting a lock detection signal when the locking of phase is entirely accomplished using the operating properties of the phase-locked loop circuit is disclosed in an effort to address the aforementioned limitations.

SUMMARY OF THE INVENTION

The present invention relates to a phase-locked loop circuit that outputs a lock detection signal only when phase lock has occurred. The present invention provides a phase-locked loop circuit that is capable of outputting a lock detection signal only when phase locking has been fully accomplished. The present invention further provides a lock detection method in which a lock detection signal is output only when the phase locking has been fully accomplished.

In one aspect, the present invention is directed to a lock detection circuit, comprising: a lock-window-entry detection circuit that detects a status of an up signal or a down signal generated by a phase frequency detector at a front edge of a delayed up signal or a delayed down signal to generate a lock-window-entry detection signal, wherein the delayed up signal or the delayed down signal is delayed substantially by as much as a lock window; and a lock-detection-signal generation circuit that counts an is input signal of a phase-locked loop circuit to generate a lock detection signal when the lock-window-entry detection signal is continuously enabled during a predetermined time period.

In one embodiment, the lock-window-entry detection signal is enabled when a pulse width of the up signal or the down signal enters the lock window.

In another embodiment, the lock-window-entry detection circuit includes: a NOR gate that performs a logical "NOR" operation on the up signal and the down signal to generate a first signal; a delay circuit that delays the first signal by a predetermined time period to generate a second signal; and a flip-flop that detects a status of the first signal at a front edge of the second signal to output the lock-window-entry detection signal.

In another embodiment, the lock window is determined according to a delay time generated by the delay circuit.

In another embodiment, the flip-flop is controlled at a falling edge of the second signal when the first signal is in a logic "high" state.

In another embodiment, the lock-detection-signal generation circuit includes: a first flip-flop that generates an output signal, which is reset by the lock detection signal and transitions at a front edge of the input signal of the phase-locked loop circuit; and second through n-th flip-flops that generates output signals that transition at a front edge of an inverted output signal of an adjacent flip-flop, wherein an output signal of the n-th flip-flop is provided as the lock detection signal.

In another embodiment, the lock detection signal is enabled when a period of time corresponding to $2^n$ times the period of the input signal of the phase-locked loop circuit has transpired after a first pulse of the input signal of the phase-locked loop circuit during when the lock-window-entry detection signal is enabled.

In another embodiment, each of the flip-flops is reset by the lock-window-entry detection signal.

In another embodiment, each of the flip-flops is a JK-type flip-flop having a J input and a K input, wherein logic "1" is applied to both the J input and the K input.

In another embodiment, the lock-detection-signal generation circuit further includes a latch circuit that latches and outputs the lock detection signal.

In another embodiment, the lock-window-entry detection signal includes: an in-window signal that is enabled when the pulse width of the up signal or the down signal is in the lock window; and an out-window signal that is enabled when the pulse width of the up signal or the down signal is out of the lock window.

In another embodiment, the lock-detection-signal generation circuit further includes a latch circuit that is set in response to the lock detection signal and that is reset in response to the out-window signal.

In another aspect, the present invention is directed to a phase-locked loop circuit, comprising: a phase frequency detector that generates an up signal and a down signal that indicate a phase difference between a reference signal and a feedback signal; a charge pump that outputs a DC voltage signal in response to a status of the up signal and the down signal; a loop filter that integrates the DC voltage signal to generate an integrated signal; a voltage-controlled oscillator that generates an oscillation signal having a frequency varying in accordance with a DC level of the integrated signal; a lock-window-entry detection circuit that detects a state of the up signal or the down signal at a front edge of a delayed up signal or a delayed down signal to generate a lock-window-entry detection signal, wherein the delayed up signal or the delayed down signal is delayed substantially by as much as a lock window; and a lock-detection-signal generation circuit that counts an input signal of the phase-locked loop circuit to generate a lock detection signal when the lock-window-entry detection signal is continuously enabled for a predetermined time period.

In one embodiment, the circuit further comprises a frequency divider that generates a low frequency feedback signal on the basis of an output signal of the voltage-controlled oscillator.

In another embodiment, the lock-window-entry detection signal is enabled when a pulse width of the up signal or the down signal enters the lock window.

In another embodiment, the lock-window-entry detection circuit includes: a NOR gate that performs a logical "NOR" operation on the up signal and the down signal to generate a first signal; a delay circuit that delays the first signal by a predetermined time period to generate a second signal; and a flip-flop that detects a status of the first signal at a front edge of the second signal.

In another embodiment, the lock window is determined according to a delay time generated by the delay circuit.

In another embodiment, the flip-flop is controlled at a falling edge of the second signal when the first signal is in a logic "high" state.

In another embodiment, the lock-detection-signal generation circuit includes: a first flip-flop that generates an output signal, which is reset by the lock detection signal, and transitions at a front edge of the input signal of the phase-locked loop circuit; and a second through n-th flip-flops that generates output signals that transition at a front edge of an inverted output signal of an adjacent prior flip-flop, wherein an output signal of the n-th flip-flop is provided as the lock detection signal.

In another embodiment, the lock detection signal is enabled when a period of time corresponding to $2^n$ times the period of the input signal of the phase-locked loop circuit has transpired after a first pulse of the input signal of the phase-locked loop circuit during when the lock-window-entry detection signal is enabled.

In another embodiment, each of the flip-flops is reset by the lock-window-entry detection signal.

In another embodiment, each of the flip-flops is a JK-type flip-flop having a J input and a K input, wherein logic "1" is applied to both the J input and the K input.

In another embodiment, the lock-detection-signal generation circuit further includes a latch circuit that latches and outputs the lock detection signal.

In another embodiment, the lock-window-entry detection signal includes: an in-window signal that is enabled when the pulse width of the up signal or the down signal is in the lock window; and an out-window signal that is enabled when the pulse width of the up signal or the down signal is out of the lock window.

In another embodiment, the lock-detection-signal generation circuit further includes a latch circuit that is set in response to the lock detection signal and that is reset in response to the out-window signal.

In another aspect, the present invention is directed to a lock detection method of a phase-locked loop circuit, comprising: detecting a status of an up signal or a down signal generated by a phase frequency detector at a front edge of a delayed up signal or the delayed down signal to generate a lock-window-entry detection signal, wherein the delayed up signal or the delayed down signal is delayed substantially by as much as a lock window; and counting an input signal of a phase-locked loop circuit to generate a lock detection signal when the lock-window-entry detection signal is continuously enabled for a predetermined time period.

In one embodiment, the lock-window-entry detection signal is enabled when a pulse width of the up signal or the down signal enters the lock window.

In another embodiment, the lock-window-entry detection signal is generated by: performing a logical "NOR" operation on the up signal and the down signal to generate a first signal; delaying the first signal by a predetermined time period to generate a second signal; and detecting a status of the first signal at a front edge of the second signal to output the lock-window-entry detection signal.

In another embodiment, the lock window is determined according to a delay time between the first signal and the second signal.

According to the present invention, the phase-locked loop circuit and method are capable of outputting the lock detection signal when the locking of phase is completed using the characteristics of respective operating regions of the phase-locked loop circuit.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

Figure 1:
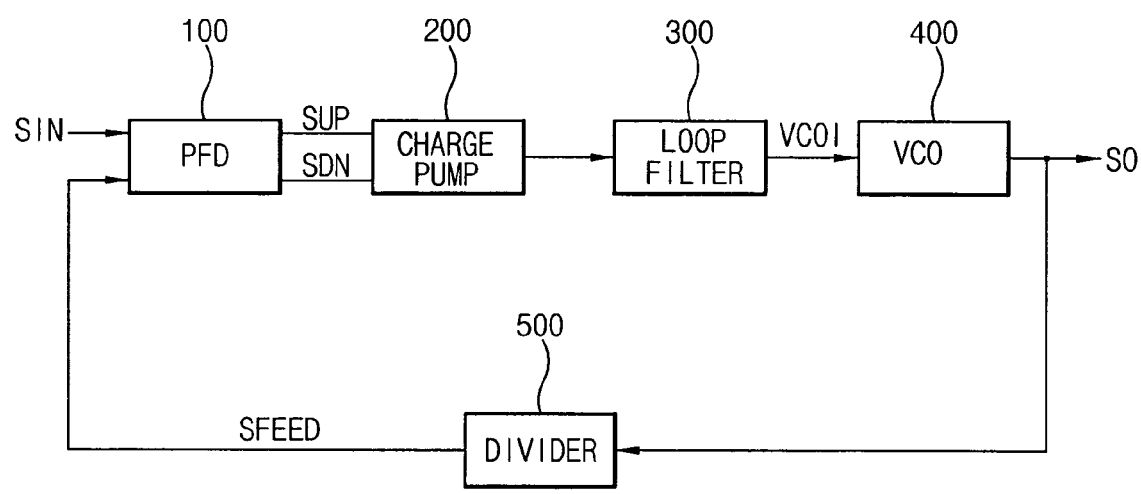
FIG. 1 is a block diagram of a conventional PLL circuit.
Figure 2:
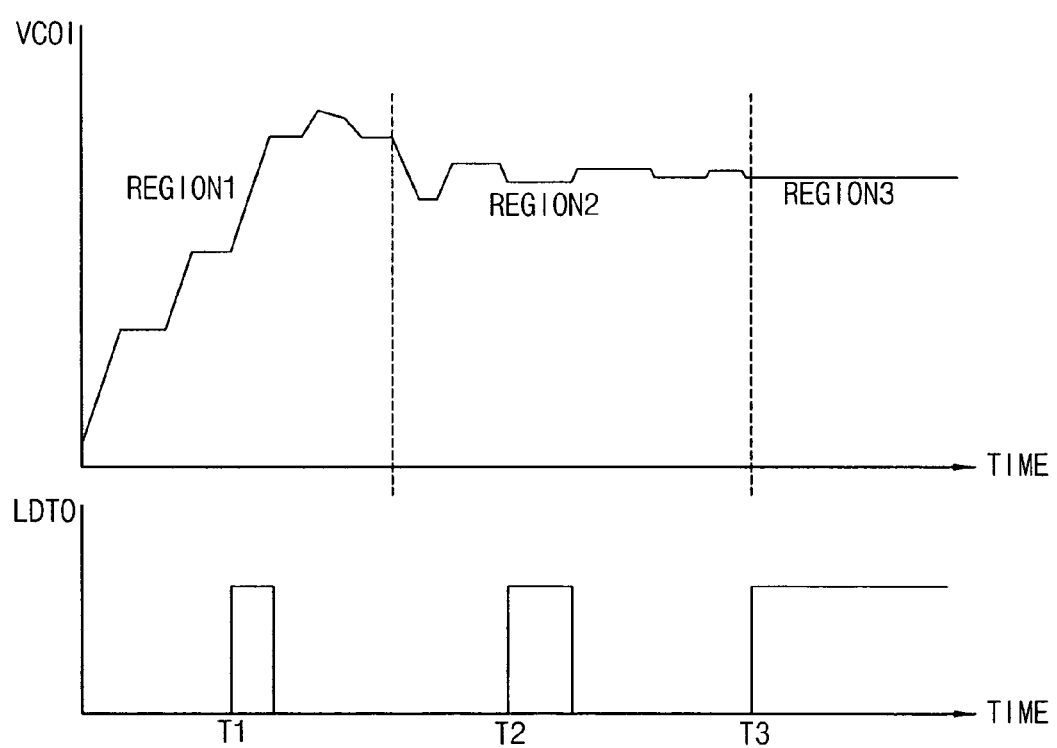
FIG. 2 is a diagram of the operation of a PLL circuit and generation of a lock detection signal in accordance with the present invention.

FIG. 2 is a diagram showing the operation of a PLL circuit and generation of a lock detection signal according to an example embodiment of the present invention.

As shown in FIG. 2, the PLL circuit can have three operating regions, first, second and third operating regions REGION1, REGION2 and REGION3, in accordance with the lapse of time occurring from power-on of a voltage-controlled oscillator (VCO) to the locking of the PLL circuit. In the first operating region REGION1, an input signal VCOI of the VCO, which is a component circuit block of the PLL circuit, has a level that increases continuously. In the second operating region REGION2, the level of the input signal VCOI of the VCO is alternatively increased or decreased so as to converge to a certain level. In the third operating region REGION3, the input signal VCOI of the VCO maintains a certain level.

It is desirable that the phase lock detection signal LDTO be generated at time T3, the point in time at which the PLL circuit enters the third operating region REGION3. However, in the conventional phase lock detection circuit, the phase lock detection signal may be generated in the first operating region REGION1 or in the second operating region REGION2.

According to an example embodiment of the present invention, the phase lock detection circuit is designed to generate the phase lock detection signal only when the PLL circuit enters the third operating region REGION3 using respective operating characteristics of the PLL circuit in the three operating regions REGION1, REGION2, and REGION3.

Figure 3:
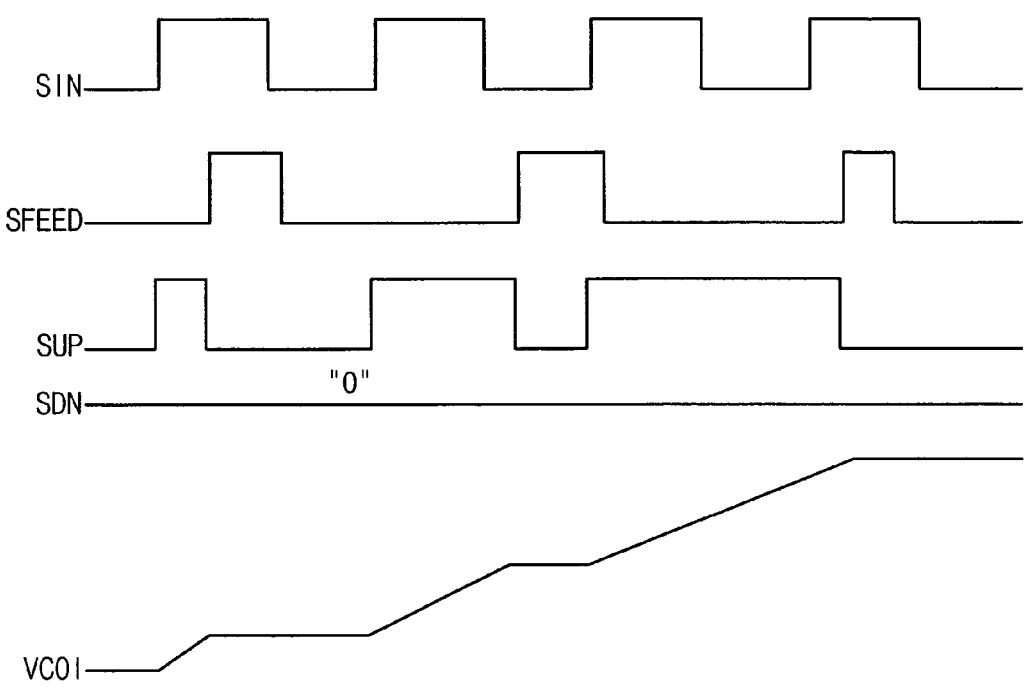
FIG. 3 is a timing diagram illustrating signals of a PLL circuit in a first operating region in FIG. 2.

FIG. 3 is a timing diagram illustrating relevant signals of the PLL circuit in the first operating region REGION1. Referring to FIG. 3, a frequency of a feedback signal SFEED is lower than that of the reference signal SIN input to the PLL circuit. The pulse width of an up signal SUP increases continuously, but a down signal SDN remains in a logic low state (for example, logic "0"). The input signal VCOI of the VCO has a level that increases continuously in response to the up signal SUP.

Figure 4:
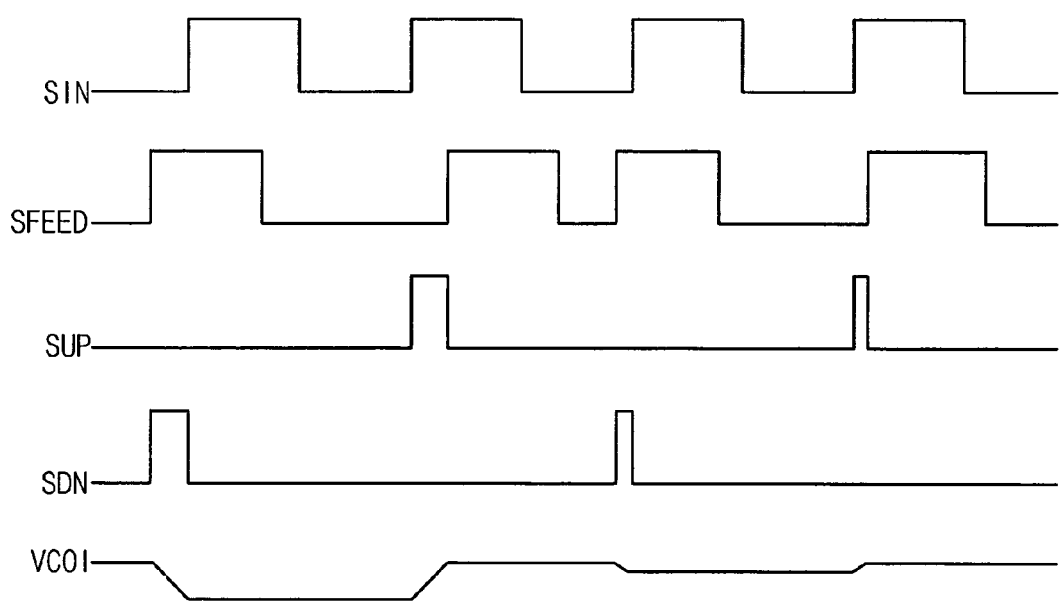
FIG. 4 is a timing diagram illustrating signals of a PLL circuit in a second operating region in FIG. 2.

FIG. 4 is a timing diagram illustrating the relevant signals of the PLL circuit in the second operating region REGION2. Referring to FIG. 4, the frequency of the reference signal SIN input to the PLL circuit is fixed, while the frequency of the feedback signal SFEED is alternatively increased or decreased. While the pulses of the up signal SUP and the down signal SDN are generated in rotation, the pulse widths of the up signal SUP and the down signal SDN are both gradually decreased. The pulse width of the input signal VCOI of the VCO is increased when the pulse of the up signal SUP is generated and decreased when the pulse of the down signal SDN is generated. Further, the oscillation amplitude of the input signal VCOI of the VCO is gradually decreased to converge to a certain level.

Figure 5:
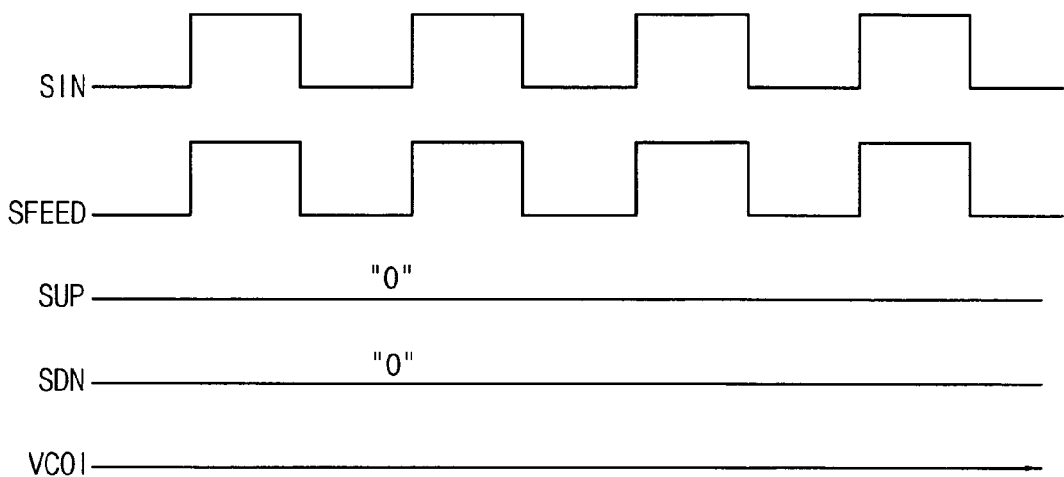
FIG. 5 is a timing diagram illustrating signals of a PLL circuit in a third operating region in FIG. 2.

FIG. 5 is a timing diagram illustrating the relevant signals of the PLL circuit in the third operating region REGION3. Referring to FIG. 5, the reference signal SIN input to the PLL circuit and the feedback signal SFEED are locked in phase with each other and have a predetermined period. The up signal SUP and the down signal SDN maintain at the logic low state (for example, logic "0"), and the input signal VCOI of the VCO 400 maintains at a certain level.

Figure 6:
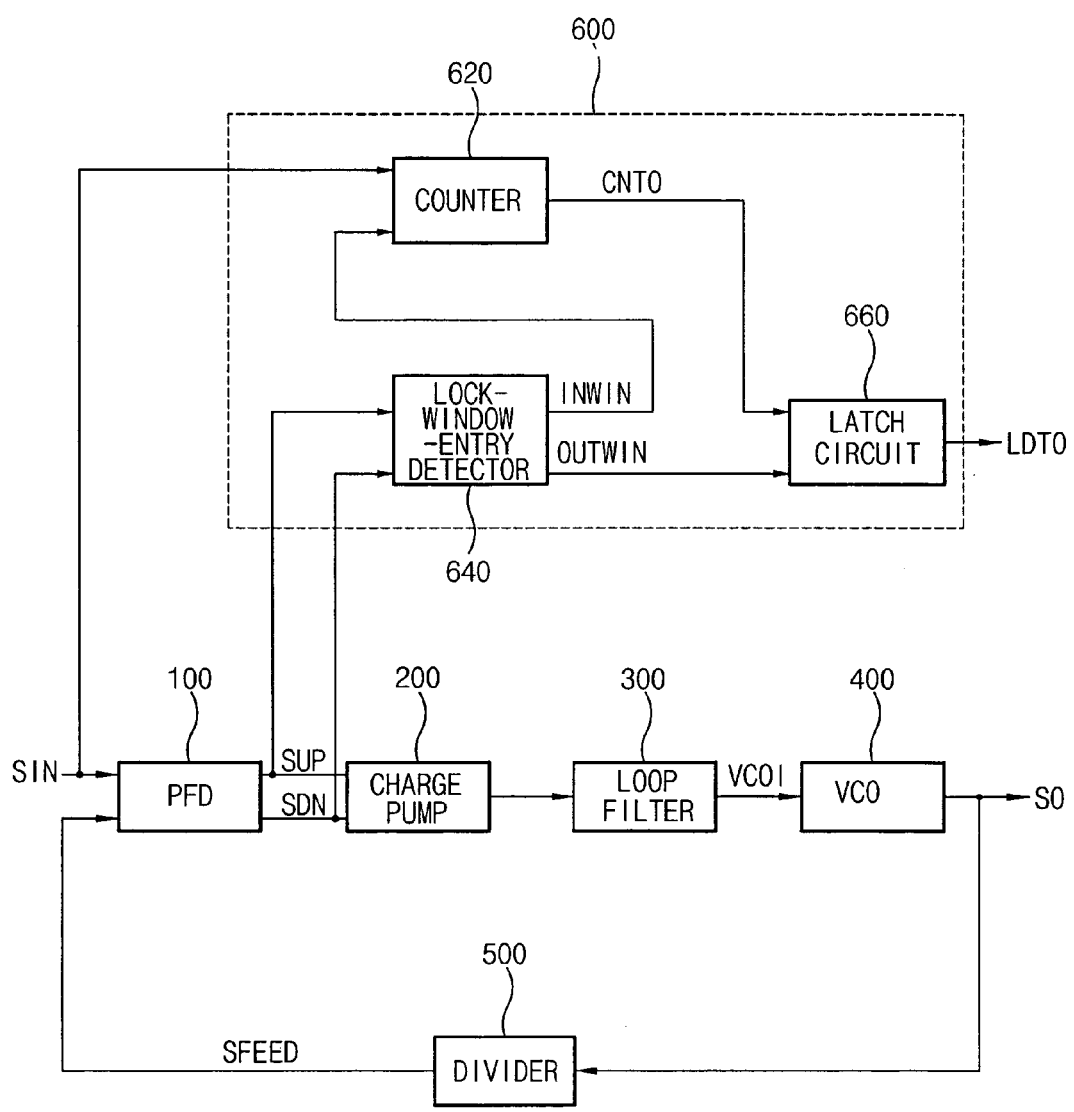
FIG. 6 is a block diagram of a PLL circuit for performing lock detection in accordance with the present invention.

FIG. 6 is a simplified block diagram illustrating the PLL circuit for performing lock detection according to an example embodiment of the present invention. The PLL circuit of FIG. 6 generates the phase lock detection signal only when the PLL circuit enters the third operating region REGION3 using the respective operating characteristics of the PLL circuit according to the operating regions REGION1, REGION2, and REGION3.

Referring to FIG. 6, the PLL circuit includes a phase-frequency detector (PFD) 100, a charge pump 200, a loop filter 300, a voltage-controlled oscillator (VCO) 400, a frequency divider 500, and a lock detection circuit 600.

The lock detection circuit 600 includes a lock-window-entry detector 640, a counter 620, and a latch circuit 660.

The lock-window-entry detector 640 sets a lock window using the up signal SUP and the down signal SDN generated by the phase-frequency detector 100 to generate an in-window signal INWIN and an out-window signal OUTWIN. The counter 620 receives the reference signal SIN and the in-window signal INWIN to generate a counter output signal CNTO after a predetermined number of pulses of the reference signal SIN are generated, while the in-window signal INWIN maintains an enabled state. The latch circuit 660 receives and latches the counter output signal CNTO and the out-window signal OUTWIN to output the lock detection signal LDTO.

Figure 7:
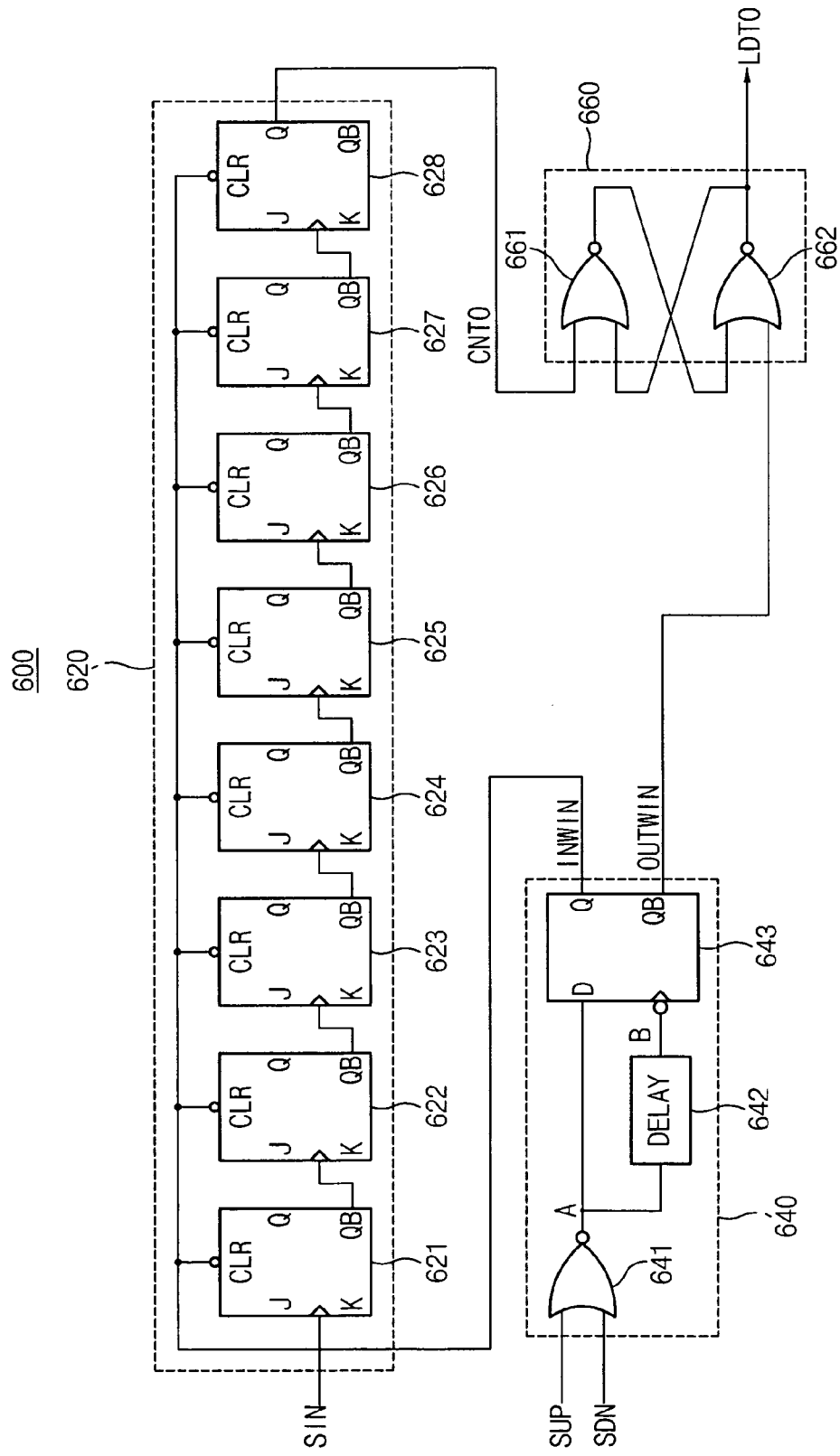
FIG. 7 is a circuit diagram illustrating a lock detection circuit in the PLL circuit of FIG. 6.

FIG. 7 is a circuit diagram illustrating the lock detection circuit 600 of the PLL circuit of FIG. 6, which includes the lock-window-entry detector 640, the counter 620, and the latch circuit 660.

The lock-window-entry detector 640, in one embodiment, includes a "NOR" gate 641, a delay circuit 642, and a D-type flip-flop 643. The "NOR" gate 641 receives the up signal SUP and the down signal SDN to perform a logical "NOR" operation on the signals SUP and SDN. The delay circuit 642 receives an output signal A of the "NOR" gate 641 and delays the output signal A by a predetermined time. The D-type flip-flop 643 has an input terminal D for receiving the output signal A of the "NOR" gate 641, a clock terminal for receiving the output signal B of the delay circuit 642, an output terminal Q for outputting the in-window signal INWIN, and an inverted output terminal QB for outputting the out-window signal OUTWIN.

The counter 620, in one embodiment, includes a plurality of JK-type flip-flops 621 to 628 that output a signal transitioning at a rising edge of an input clock when J input and K input are all logic high level (for example, logic "1"). A first flip-flop 621 is reset by the in-window signal INWIN and generates an output signal that transitions at a rising edge of the reference signal SIN. Second to n-th flip-flops 622 to 628 each generate an output signal that transitions at the rising edge of a signal output from the inverted output terminal QB of an adjacent prior flip-flop. The count output signal CNTO is output from the output terminal Q of the n-th flip-flop 628.

The latch circuit 660, in one embodiment, includes two "NOR" gates 661 and 662 which are cross-coupled to each other. Further, the latch circuit 660 receives and latches the count output signal CNTO and the out-window signal OUTWIN to output the lock detection signal LDTO.

Figure 8:
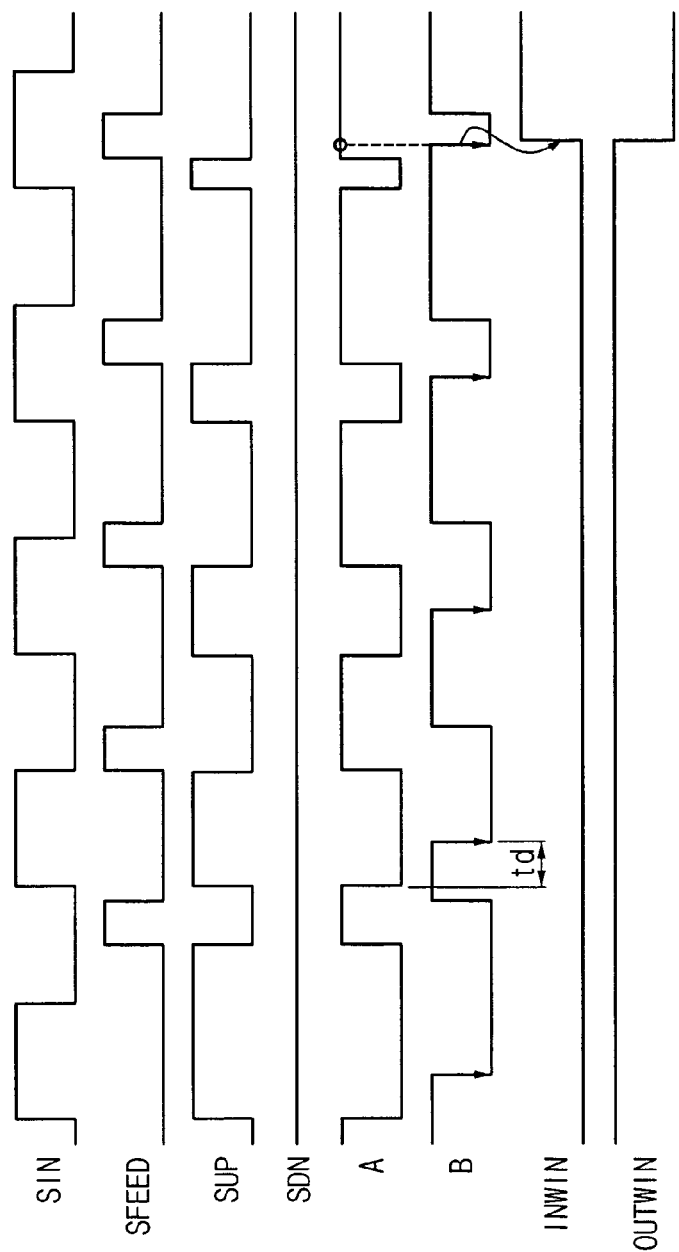
FIG. 8 is a timing diagram illustrating signals of the PLL circuit of FIG. 6 and the lock detection circuit of FIG. 7 in the first operating region.

FIG. 8 is a timing diagram illustrating relevant signals of the PLL circuit of FIG. 6 and the lock detection circuit of FIG. 7 when operating in the first operating region.

Figure 9:
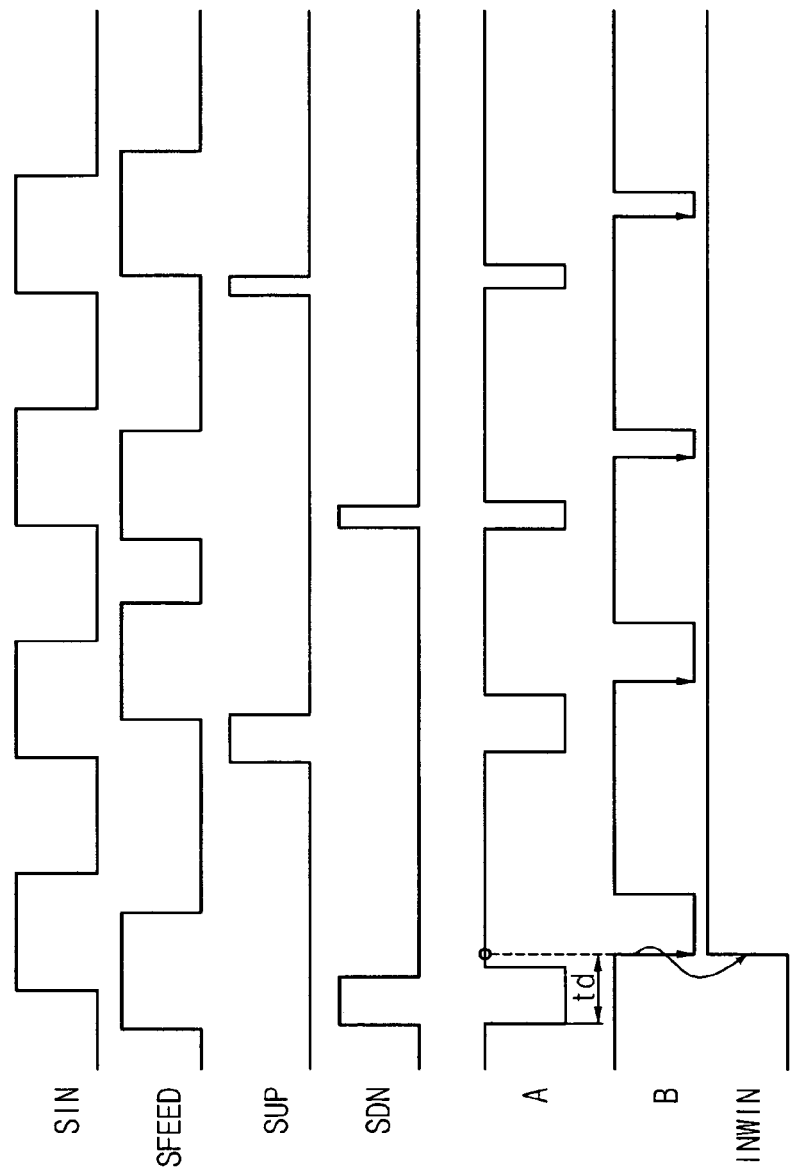
FIG. 9 is a timing diagram illustrating signals of the PLL circuit of FIG. 6 and the lock detection circuit of FIG. 7 in the second operating region assuming a long time delay.
Figure 10:
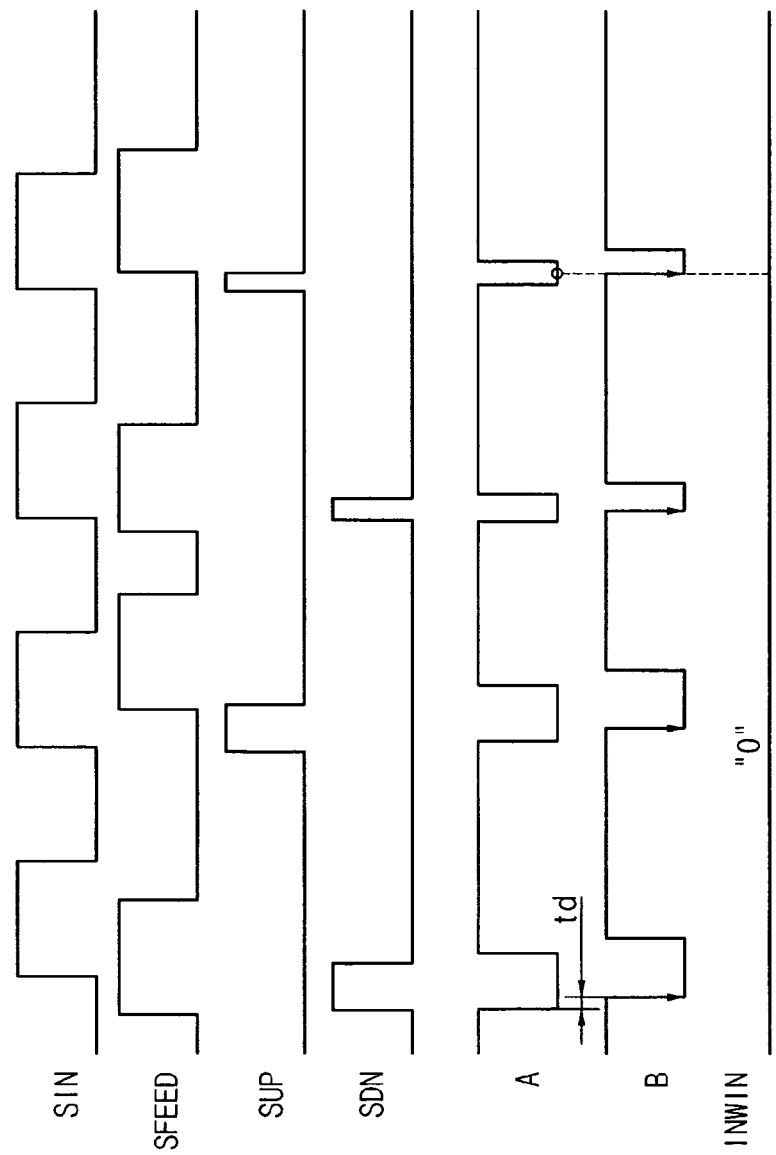
FIG. 10 is a timing diagram illustrating signals of the PLL circuit of FIG. 6 and the lock detection circuit of FIG. 7 in the second operating region assuming a short time delay.

FIG. 9 is a timing diagram illustrating relevant signals of the PLL circuit of FIG. 6 and the lock detection circuit of FIG. 7 when operating in the second operating region when the delay time is long, and FIG. 10 is a timing diagram illustrating the relevant signals of the PLL circuit of FIG. 6 and the lock detection circuit of FIG. 7 when operating in the second operating region when the delay time is short.

Figure 11:
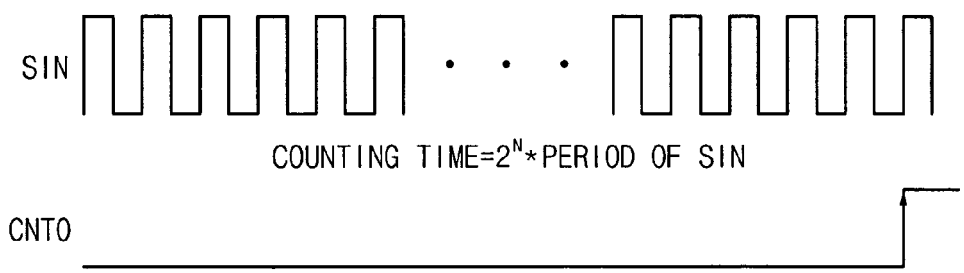
FIG. 11 is a diagram illustrating the operation of the counter in the PLL circuit of FIG. 6.
Figure 12:
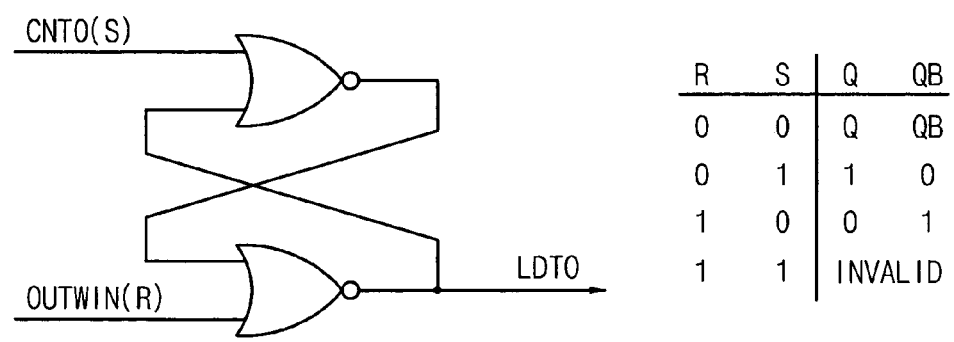
FIG. 12 is a logic diagram illustrating a latch circuit in the PLL circuit of FIG. 6.

FIG. 11 is a diagram illustrating the operation of the counter 620 in the PLL circuit of FIG. 6, and FIG. 12 is a logic diagram illustrating latch circuit 660 and the operation of the latch circuit 660 of the PLL circuit of FIG. 6.

Referring to FIG. 6 through FIG. 12, the operation of the PLL circuit for lock detection according to an example embodiment of this invention will be described below.

The PFD 100 generates the up signal SUP and the down signal SDN based on the phase difference (and/or frequency difference) between the reference signal SIN and the feedback signal SFEED. The charge pump 200 generates a DC voltage signal in response to level states of the up signal SUP and the down signal SDN to provide the DC voltage signal to the loop filter 300. The loop filter 300 integrates the DC voltage signal received from the charge pump 200 to generate the VCOI signal in which a high frequency component is removed. The VCO 400 outputs a high frequency signal having a frequency varying according to a DC level of the input signal VCOI of the VCO 400. The frequency divider 500 generates a low frequency feedback signal SFEED on the basis of the high frequency signal output from the VCO 400. The feedback signal SFEED is applied to the PFD 100. When the PLL circuit is in the lock mode, the phase (or frequency) of the reference signal SIN and the phase of the feedback signal SFEED are locked with each other. When the PLL is not in the lock mode, the phase (or frequency) of the reference signal SIN and the phase of the feedback signal SFEED are not locked with each other.

The operation of the lock-window-entry detector 640 is as follows.

Referring to FIG. 8, in the first operating region (for example REGION1 shown in FIG. 2), a large time skew is present between the reference signal SIN and the feedback signal SFEED, and the up signal SUP and the down signal SDN are generated based on the time skew. The period of the logic "1" for the up signal SUP increases gradually in the first operating region REGION1 and decreases gradually as the PLL circuit approaches the second operating region (REGION2 shown in FIG. 2). The down signal SDN is maintained in the state of the logic "0" in the first operating region REGION1.

The "NOR" gate 641 of the lock-window-entry detector 640 receives the up signal SUP and the down signal SDN to perform the logical "NOR" operation on the signals SUP and SDN. When the PLL circuit operates in the first operating region REGION1, the output signal A of the NOR gate 641 has a waveform in which the state of logic "0" is relatively long. When the PLL circuit operates approaching the second operating region REGION2, the output signal A of the NOR gate 641 has a waveform, in which the state of logic "0" is relatively short. The output signal B of the delay circuit 642 delayed by a predetermined time interval (td) has the same period as the output signal A of the "NOR" gate 641. According to the amount of delay time td generated by the delay circuit 642, the boundary of the first operating region REGION1 and the second operating region REGION2 is defined. Namely, the lock window is determined according to the amount of the delay time td. The output signals INWIN and OUTWIN of the D-type flip-flop 643 change their logic states at the falling edge of the output signal B of the delay circuit 642 in response to the logic state of the output signal A of the "NOR" gate 641. As shown in FIG. 8, the in-window signal INWIN changes from logic "0" to logic "1" at the falling edge of the signal B when the logic state of the output signal A is logic "1". The in-window signal INWIN indicates that the PLL circuit enters the second operating region, and functions to reset the counter 620.

When the in-window signal INWIN is in the logic "0" state, the counter output signal CNTO is in the logic "0" state and the out-window signal OUTWIN is in the logic "1" state. Thus, the lock detection signal LDTO is in the logic "0" state. Namely, the lock detection circuit 600 does not generate the lock detection signal LDTO when operating in this region.

As the synchronization is performed, the frequency (or phase) difference between the reference signal SIN and the feedback signal SFEED is gradually decreased.

Accordingly, when the pulse width of the up signal SUP is smaller than the delay time td generated by the delay circuit 642, the lock-window-entry detector 640 transitions to the logic "1" state. When the in-window signal INWIN is in the logic "1" state, the counter 620 is not reset. The counter 620 generates the output signal CNTO after a time period corresponding to a number of JK-type flip-flops 621 to 628. When the number of JK-type flip-flops is N, the counting time generated by the counter 620 may be $2^N$ times the period of the reference signal SIN, as shown in FIG. 11. The JK-type flip-flops 621 to 628 may function as a T-type flip-flop because a logic "1" is applied to both the J input terminal and K input terminal. When the output signal CNTO of the counter 620 becomes the logic "1" state, the PLL circuit enters the third operating region REGION3.

As shown in FIG. 9, when the delay time td is set long, the PLL circuit enters the second operating region REGION2 more quickly. On the contrary, as shown in FIG. 10, when the delay time td is set short, the PLL circuit enters the second operating region REGION2 more slowly.

Referring to FIG. 12, the latch circuit corresponds to the RS latch circuit including two "NOR" gates that are cross-coupled to each other. In FIG. 12, the counter output signal CNTO corresponds to an S input and the out-window signal OUTWIN corresponds to an R input. The RS latch circuit operates according to a truth table shown in FIG. 12.

When the out-window signal OUTWIN is in the logic "1" state and the counter output signal CNTO is in the logic "0"

state, the output Q becomes logic "0". Further, when the out-window signal OUTWIN is in the logic "0" state and the counter output signal CNTO is in the logic "1" state, the output Q becomes logic "1". Here, the output signal Q of the latch circuit 660 is the lock detection signal LDTO.

Figure 13:
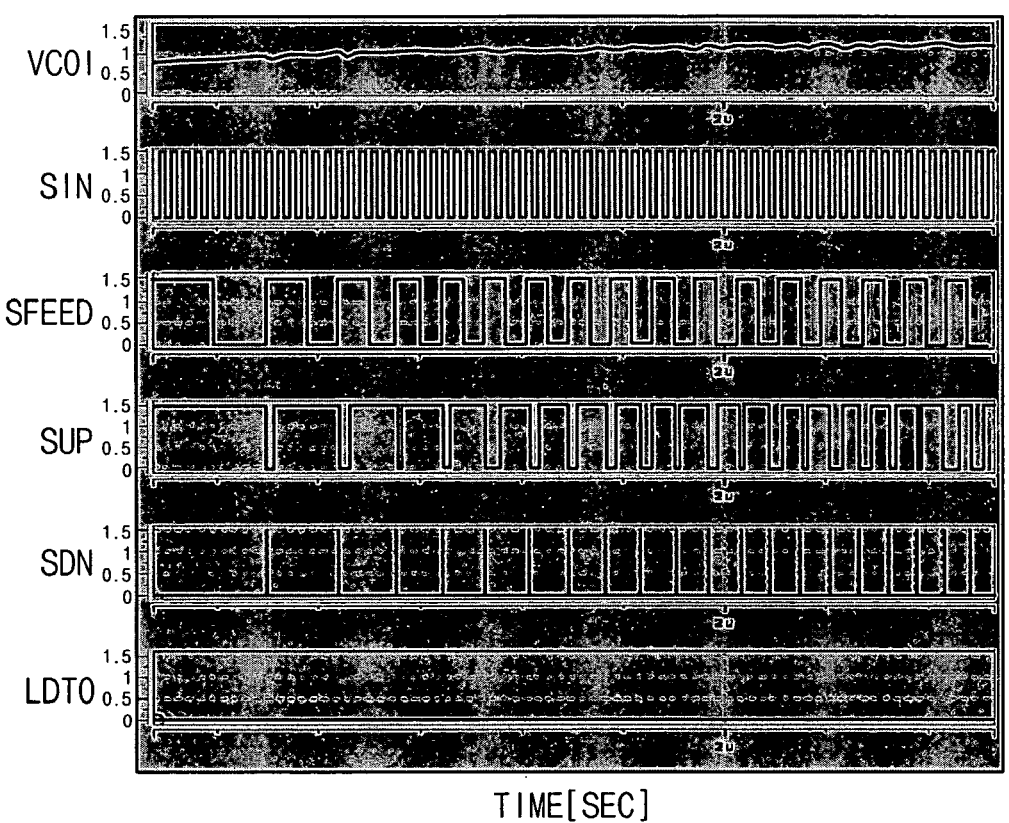
FIG. 13 is a waveform diagram of simulation results for the PLL circuit shown in FIG. 6 operating in the first operating region.

FIG. 13 is a waveform diagram showing the simulation results for relevant signals of the PLL circuit shown in FIG. 6 when the PLL circuit operates in the first operating region.

Figure 14:
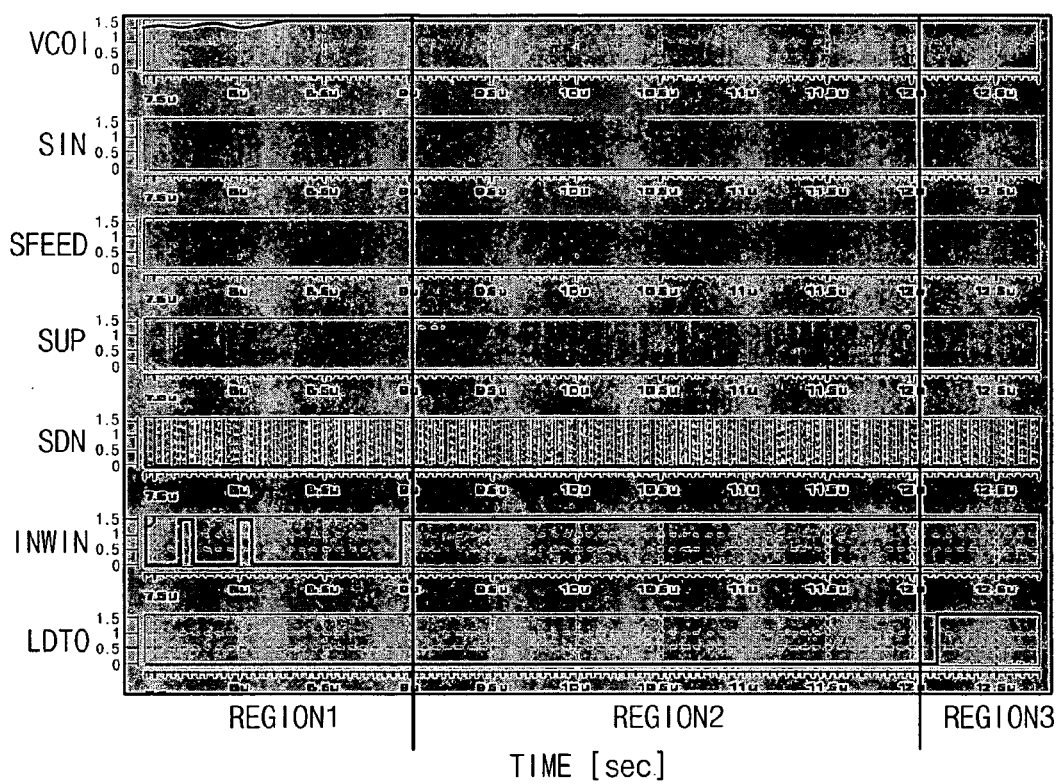
FIG. 14 is a waveform diagram of simulation results for the PLL circuit shown in FIG. 6 operating in the first through the third operating regions.

FIG. 14 is a waveform diagram showing the simulation results for relevant signals of the PLL circuit shown in FIG. 6 operating the first through third operating regions.

Figure 15:
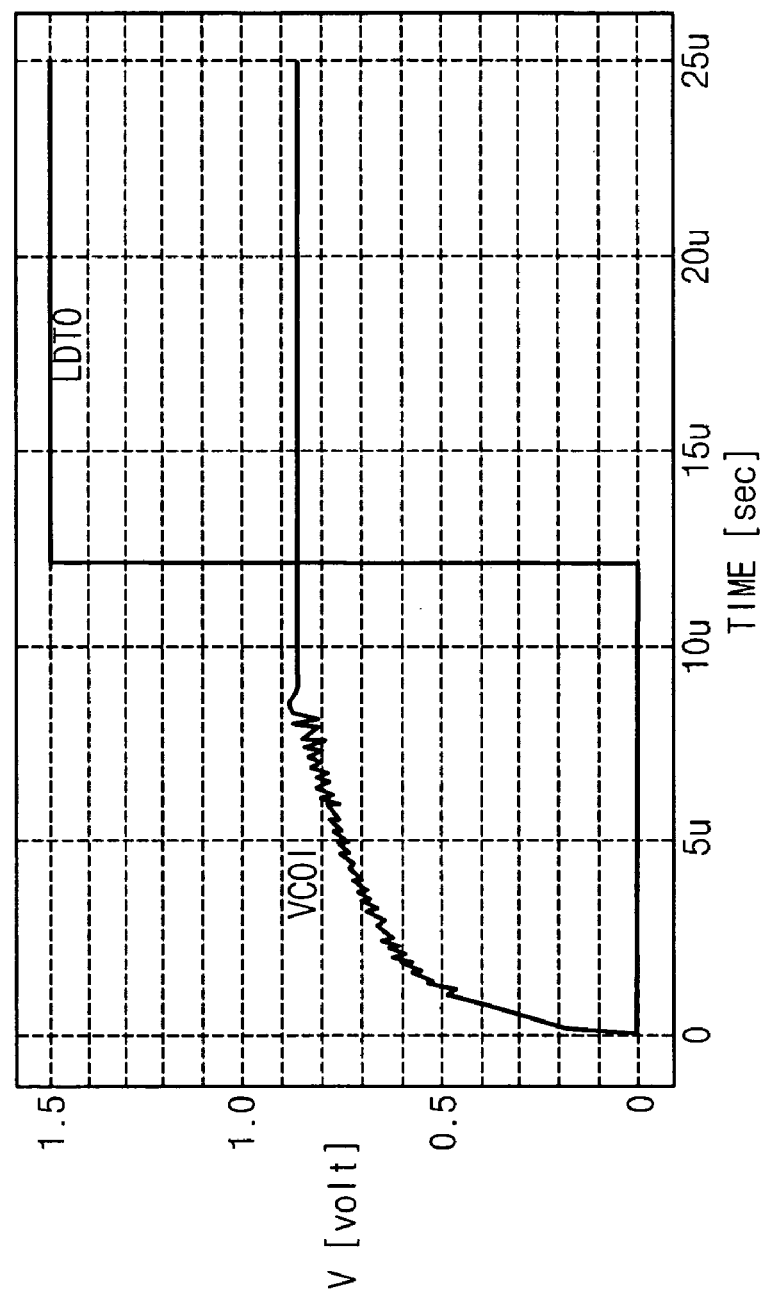
FIG. 15 is a waveform diagram of simulation results for a VCO input signal and a lock detection signal of the PLL circuit of FIG. 6.

FIG. 15 is a diagram showing the simulation results for the VCO input signal VCOI and the lock detection signal LDTO of the PLL circuit of FIG. 6.

The simulation results shown in FIG. 13 to FIG. 15 are results when an example lock detector of the present invention is applied to the PLL circuit for a frequency synthesizer using a non-dead zone PFD. As the non-dead zone PFD was used, the period in which the up signal SUP and the down signal SDN were simultaneously in the logic "1" state.

The simulation was carried out under the conditions that the delay time of the delay circuit 642 in the lock-window-entry detector 640 was 8 nsec, the delay time of PFD was 4 nsec, and the frequency of the reference signal was 40 MHz.

The lock window was set to 4 nsec to secure the stability and the 128-counter comprised of seven JK flip-flops was employed to secure the accuracy. The counting time generated by the counter 620 was 128×25 nsec=3.2 usec. When the delay time generated by the delay circuit 642 in the lock-window-entry detector 640 is decreased, the time point at which the lock detector 600 outputs the lock detection signal LDTO may be late, but the detection signal LDTO that represents when the PLL circuit enters the lock state, is output at a time point at which the PLL circuit approaches closer to the target frequency.

Referring to FIG. 13, when the PLL circuit is in the first operating region RESION1, the pulse width of the up signal SUP is relatively wide, while the pulse width of the down signal SDN is relatively narrow. The output signal A of the "NOR" gate 641 in the lock-window-entry detector 640 has the logic "0" state, much longer than the delay time td generated by the delay circuit 642. Therefore, the in-window signal INWIN maintains the logic "0" state. In the first operating region REGION1, the up signal SUP and the down signal SDN do not appear in rotation, but the up signal appears for the most part of the first operating region REGION1. Therefore, the counter 620 is in the disabled state.

Referring to FIG. 14, the PLL circuit approaches the second operating region REGION2, at the point in time at which the in-window signal INWIN output from the lock-window-entry detector 640 transitions to the logic "1" state. The lock detection signal LDTO is generated after the counting time generated by the counter 620, while the skew between the reference signal SIN and the feedback signal SFEED is in the lock window.

As shown in FIG. 15, the lock detection signal LDTO is generated after the input signal VCOI of VCO (400 of FIG. 6) is sufficiently stabilized, i.e., the phase locking of the PLL circuit is sufficiently achieved.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A lock detection circuit, comprising:
    a lock-window-entry detection circuit that detects a status of an up signal or a down signal generated by a phase frequency detector at a front edge of a delayed up signal or a delayed down signal to generate a lock-window-entry detection signal, wherein the delayed up signal or the delayed down signal is delayed substantially by as much as a lock window; and
    a lock-detection-signal generation circuit that counts an input signal of a phase-locked loop circuit to generate a lock detection signal when the lock-window-entry detection signal is continuously enabled during a predetermined time period.

2. The lock detection circuit of claim 1, wherein the lock-window-entry detection signal is enabled when a pulse width of the up signal or the down signal enters the lock window.

3. The lock detection circuit of claim 1, wherein the lock-window-entry detection circuit includes:
    a NOR gate that performs a logical "NOR" operation on the up signal and the down signal to generate a first signal;
    a delay circuit that delays the first signal by a predetermined time period to generate a second signal; and
    a flip-flop that detects a status of the first signal at a front edge of the second signal to output the lock-window-entry detection signal.

4. The lock detection circuit of claim 3, wherein the lock window is determined according to a delay time generated by the delay circuit.

5. The lock detection circuit of claim 3, wherein the flip-flop is controlled at a falling edge of the second signal when the first signal is in a logic "high" state.

6. The lock detection circuit of claim 1, wherein the lock-detection-signal generation circuit includes:
    a first flip-flop that generates an output signal, which is reset by the lock detection signal and transitions at a front edge of the input signal of the phase-locked loop circuit; and
    second through n-th flip-flops that generates output signals that transition at a front edge of an inverted output signal of an adjacent flip-flop, wherein an output signal of the n-th flip-flop is provided as the lock detection signal.

7. The lock detection circuit of claim 6, wherein the lock detection signal is enabled when a period of time corresponding to $2^n$ times the period of the input signal of the phase-locked loop circuit has transpired after a first pulse of the input signal of the phase-locked loop circuit during when the lock-window-entry detection signal is enabled.

8. The lock detection circuit of claim 6, wherein each of the flip-flops is reset by the lock-window-entry detection signal.

9. The lock detection circuit of claim 6, wherein each of the flip-flops is a JK-type flip-flop having a J input and a K input, wherein logic "1" is applied to both the J input and the K input.

10. The lock detection circuit of claim 6, wherein the lock-detection-signal generation circuit further includes a latch circuit that latches and outputs the lock detection signal.

11. The lock detection circuit of claim 6, wherein the lock-window-entry detection signal includes:
    an in-window signal that is enabled when the pulse width of the up signal or the down signal is in the lock window; and
    an out-window signal that is enabled when the pulse width of the up signal or the down signal is out of the lock window.

12. The lock detection circuit of claim 11, wherein the lock-detection-signal generation circuit further includes a latch circuit that is set in response to the lock detection signal and that is reset in response to the out-window signal.

13. A phase-locked loop circuit, comprising:
a phase frequency detector that generates an up signal and a down signal that indicate a phase difference between a reference signal and a feedback signal;
a charge pump that outputs a DC voltage signal in response to a status of the up signal and the down signal;
a loop filter that integrates the DC voltage signal to generate an integrated signal;
a voltage-controlled oscillator that generates an oscillation signal having a frequency varying in accordance with a DC level of the integrated signal;
a lock-window-entry detection circuit that detects a state of the up signal or the down signal at a front edge of a delayed up signal or a delayed down signal to generate a lock-window-entry detection signal, wherein the delayed up signal or the delayed down signal is delayed substantially by as much as a lock window; and
a lock-detection-signal generation circuit that counts an input signal of the phase-locked loop circuit to generate a lock detection signal when the lock-window-entry detection signal is continuously enabled for a predetermined time period.

14. The phase-locked loop circuit of claim 13, further comprising a frequency divider that generates a low frequency feedback signal on the basis of an output signal of the voltage-controlled oscillator.

15. The phase-locked loop circuit of claim 13, wherein the lock-window-entry detection signal is enabled when a pulse width of the up signal or the down signal enters the lock window.

16. The phase-locked loop circuit of claim 13, wherein the lock-window-entry detection circuit includes:
a NOR gate that performs a logical "NOR" operation on the up signal and the down signal to generate a first signal;
a delay circuit that delays the first signal by a predetermined time period to generate a second signal; and
a flip-flop that detects a status of the first signal at a front edge of the second signal.

17. The phase-locked loop circuit of claim 16, wherein the lock window is determined according to a delay time generated by the delay circuit.

18. The phase-locked loop circuit of claim 16, wherein the flip-flop is controlled at a falling edge of the second signal when the first signal is in a logic "high" state.

19. The phase-locked loop circuit of claim 13, wherein the lock-detection-signal generation circuit includes:
a first flip-flop that generates an output signal, which is reset by the lock detection signal, and transitions at a front edge of the input signal of the phase-locked loop circuit; and
a second through n-th flip-flops that generates output signals that transition at a front edge of an inverted output signal of an adjacent prior flip-flop, wherein an output signal of the n-th flip-flop is provided as the lock detection signal.

20. The phase-locked loop circuit of claim 19, wherein the lock detection signal is enabled when a period of time corresponding to $2^n$ times the period of the input signal of the phase-locked loop circuit has transpired after a first pulse of the input signal of the phase-locked loop circuit during when the lock-window-entry detection signal is enabled.

21. The phase-locked loop circuit of claim 19, wherein each of the flip-flops is reset by the lock-window-entry detection signal.

22. The phase-locked loop circuit of claim 19, wherein each of the flip-flops is a JK-type flip-flop having a J input and a K input, wherein logic "1" is applied to both the J input and the K input.

23. The phase-locked loop circuit of claim 19, wherein the lock-detection-signal generation circuit further includes a latch circuit that latches and outputs the lock detection signal.

24. The phase-locked loop circuit of claim 19, wherein the lock-window-entry detection signal includes:
an in-window signal that is enabled when the pulse width of the up signal or the down signal is in the lock window; and
an out-window signal that is enabled when the pulse width of the up signal or the down signal is out of the lock window.

25. The phase-locked loop circuit of claim 24, wherein the lock-detection-signal generation circuit further includes a latch circuit that is set in response to the lock detection signal and that is reset in response to the out-window signal.

26. A lock detection method of a phase-locked loop circuit, comprising:
detecting a status of an up signal or a down signal generated by a phase frequency detector at a front edge of a delayed up signal or the delayed down signal to generate a lock-window-entry detection signal, wherein the delayed up signal or the delayed down signal is delayed substantially by as much as a lock window; and
counting an input signal of a phase-locked loop circuit to generate a lock detection signal when the lock-window-entry detection signal is continuously enabled for a predetermined time period.

27. The lock detection method of a phase-locked loop circuit of claim 26, wherein the lock-window-entry detection signal is enabled when a pulse width of the up signal or the down signal enters the lock window.

28. The lock detection method of a phase-locked loop circuit of claim 26, wherein the lock-window-entry detection signal is generated by:
performing a logical "NOR" operation on the up signal and the down signal to generate a first signal;
delaying the first signal by a predetermined time period to generate a second signal; and
detecting a status of the first signal at a front edge of the second signal to output the lock-window-entry detection signal.

29. The lock detection method of a phase-locked loop circuit of claim 28, wherein the lock window is determined according to a delay time between the first signal and the second signal.

* * * * *